(12) United States Patent
Jeong et al.

(10) Patent No.: US 8,143,889 B2
(45) Date of Patent: Mar. 27, 2012

(54) SIMULTANEOUS ACQUISITIONS OF SPIN- AND STIMULATED-ECHO PLANAR IMAGING

(75) Inventors: Eun-Kee Jeong, North Salt Lake, UT (US); Kim Seongeun Choi, Salt Lake City, UT (US); Xianfeng Shi, Salt Lake City, UT (US)

(73) Assignee: University of Utah Research Foundation, Salt Lake City, UT (US)

(*) Notice: Subject to any disclaimer, the term of this patent is extended or adjusted under 35 U.S.C. 154(b) by 479 days.

(21) Appl. No.: 12/392,072

(22) Filed: Feb. 24, 2009

(65) Prior Publication Data

US 2010/0213938 A1    Aug. 26, 2010

(51) Int. Cl.
*G01V 3/00* (2006.01)
*A61B 5/05* (2006.01)

(52) U.S. Cl. ........ 324/309; 324/307; 324/318; 600/410; 600/420; 600/431

(58) Field of Classification Search .......... 324/300–322; 382/128–131; 600/407–435
See application file for complete search history.

(56) References Cited

U.S. PATENT DOCUMENTS

| | | | | |
|---|---|---|---|---|
| 2,718,629 A | * | 9/1955 | Anderson et al. | 365/152 |
| 4,551,679 A | * | 11/1985 | Bossaert | 324/309 |
| 4,862,082 A | * | 8/1989 | Hennig | 324/309 |
| 4,866,386 A | * | 9/1989 | Sattin | 324/314 |
| 5,237,273 A | * | 8/1993 | Plewes et al. | 324/309 |
| 5,565,776 A | * | 10/1996 | Kanazawa | 324/306 |
| 5,818,229 A | * | 10/1998 | Kanazawa | 324/309 |
| 7,053,611 B2 | * | 5/2006 | Freedman | 324/303 |
| 7,622,919 B2 | * | 11/2009 | Song et al. | 324/307 |
| 7,852,077 B2 | * | 12/2010 | Song et al. | 324/309 |
| 2005/0270023 A1 | * | 12/2005 | Freedman | 324/303 |
| 2008/0024128 A1 | * | 1/2008 | Song et al. | 324/307 |
| 2010/0134104 A1 | * | 6/2010 | Song et al. | 324/309 |
| 2010/0213938 A1 | * | 8/2010 | Jeong et al. | 324/309 |

OTHER PUBLICATIONS

Aletras, et al., "Dense: Displacement Encoding with Stimulated Echoes in Cardiac Functional MRI," Journal of Magnetic Resonance, (1999), pp. 247-252, vol. 137, IDEAL.

Cohen, et al., "Ultra-Fast Imaging," Magnetic Resonance Imaging, (1991) pp. 1-37, vol. 9, No. 1.

(Continued)

*Primary Examiner* — Melissa Koval
*Assistant Examiner* — Tiffany Fetzner
(74) *Attorney, Agent, or Firm* — Alexander J Burke

(57) ABSTRACT

The disclosure provides echo planar imaging (EPI) based single-shot imaging techniques for acquiring spin-EPI (SEPI) and stimulated-EPI after a single RF excitation. In certain embodiments, the SEPI and STEPI acquired in a singleshot are used to compute a $T_1$ map in realtime, which can be used for realtime monitoring of concentrations of paramagnetic-ion based contrast agent in dynamic contrast enhanced MRI. In certain embodiments, $B_1$ field inhomogeneity correction is provided for the STEPI. In certain embodiments, a gradient-EPI (GEPI) is also acquired after the single RF excitation providing singleshot SEPI, GEPI and STEPI acquisition. In certain embodiments, the phase difference between the SEPI and GEPI is used to compute temperature-dependent chemical shift in a subject in realtime. The temperature-dependent chemical shift can be used to monitor temperature changes in the subject in realtime, for example, during a heat treatment to control the dosage of heat energy.

20 Claims, 13 Drawing Sheets

OTHER PUBLICATIONS

Deoni, et al., "Rapid Combined $T_1$ and $T_2$ Mapping Using Gradient Recalled Acquisition in the Steady State," Magnetic Resonance in Medicine, (2003), pp. 515-526, vol. 49, Wiley-Liss, Inc.

Farrell, et al., "High b-Value q-Space Diffusion-Weighted MRI of the Human Cervical Spinal Cord In Vivo: Feasibility and Application to Multiple Sclerosis," Magnetic Resonance in Medicine, (2008) pp. 1079-1089, vol. 59, Wiley-Liss, Inc.

Farzaneh, et al., "Analysis of T2 Limitations and Off-Resonance Effects on Spatial Resolution and Artifacts in Echo-Planar Imaging," Magnetic Resonance in Medicine, (1990) pp. 123-139, vol. 14, Academic Press, Inc.

Feng, et al., Characterization of Tumor Angiogenesis With Dynamic contrast-Enhanced MRI and Biodegradable Macromolecular Contrast Agents in Mice, Magnetic Resonance in Medicine, (2008), pp. 1347-1352, vol. 60, Wiley-Liss, Inc.

Frahm, et al., "Localized High-Resolution Proton NMR Spectroscopy Using Stimulated Echoes: Initial Applications to Human Brain in Vivo," Magnetic Resonance in Medicine, (1989), pp. 79-93, vol. 9, Academic Press, Inc.

Gowland, et al., "Accurate Measurement of $T_1$ in Vivo in Less Than 3 Seconds Using Echo-Planar Imaging," Magnetic Resonance in Medicine, (1993) pp. 351-354, vol. 30, Williams & Wilkins.

Guo, et al., "Improved accuracy and consistency in $T_1$ measurement of flowing blood by using inversion recovery GE-EPI," Med. Phys., Apr. 2005, pp. 1083-1093, vol. 32, No. 4, Am. Assoc. Phys. Med.

Haase, et al., "MR Imaging Using Stimulated Echoes (STEAM)[1]," Radiology, (1986), pp. 787-790, vol. 160, RSNA.

Jeong, et al., "High-Resolution DTI of a Localized Volume Using 3D Single-Shot Diffusion-Weighted Stimulated Echo-Planar Imaging (3D ss-DWSTEPI)," Magnetic Resonance in Medicine, (2006), pp. 1173-1181, vol. 56, Wiley-Liss, Inc.

Jeong, et al., "High-Resolution DTI with 2D Interleaved Multislice Reduced FOV Single-Shot Diffusion-Weighted EPI (2D ss-rFOV-DWEPI)," Magnetic Resonance in Medicine, (2005) pp. 1575-1579, vol. 54, Wiley-Liss, Inc.

Li, et al., "MRI in ocular drug delivery," NMR Biomed., Jan. 9, 2008, pp. 941-956, vol. 21, John Wiley & Sons, Ltd.

Liu, et al., "Rapid Simultaneous Data acquisition of T1 and T2 Mapping, using Multishot EPI and Automated Variations of TR and TE at 3T," Proc. Intl. Soc. Mag. Reson. Med., (2007), p. 1787, vol. 15.

Look, et al., "Time Saving in Measurement of NMR and EPR Relaxation Times," The Review of Scientific Instruments, Feb. 1970, pp. 250-251, vol. 41, No. 2, AIP.

Merboldt, et al., "Diffusion Imaging of the Human Brain in Vivo Using High-Speed Steam MRI," Magnetic Resonance in Medicine, (1992), pp. 179-192, vol. 23, Academic Press, Inc.

Molokhia, et al., "Transscleral iontophoretic and intravitreal delivery of a macromolecule: Study of ocular distribution in vivo and postmortem with MRI," Experimental Eye Research, (2009), pp. 418-425, vol. 88, Elsevier Ltd.

Norris, "Implications of Bulk Motion for Diffusion-Weighted Imaging Experiments: Effects, Mechanisms, and Solutions," Journal of Magnetic Resonance Imaging, (2001), pp. 486-495, vol. 13, Wiley-Liss, Inc.

Quesson, et al., "Magnetic Resonance Temperature Imaging for Guidance of Thermotherapy," Journal of Magnetic Resonance Imaging, (2000), pp. 525-533, vol. 13, Wiley-Liss, Inc.

Riesberg, et al., "Two-Dimensional Spatially-Selective RF Excitation Pulses in Echo-Planar Imaging," Magnetic Resonance in Medicine, (2002), pp. 1186-1193, vol. 47, Wiley-Liss, Inc.

Saritas, et al., "DWI of the Spinal Cord with Reduced FOV Single-Shot EPI," (2008), pp. 468-473, vol. 60. Wiley-Liss, Inc.

Wang, et al., "Noninvasive Visualization of Pharmacokinetics, Biodistribution and Tumor Targeting of Poly[N-(2-hydroxyproply)methacrylamide] in Mice Using Contrast Enhanced MRI," Pharmaceutical Research, Jun. 2007, pp. 1208-1216, vol. 24, No. 6, Springer Science + Business Media, LLC.

* cited by examiner (a)

(b)

SIMULTANEOUS ACQUISITIONS OF SPIN- AND STIMULATED-ECHO PLANAR IMAGING

FIELD

This application relates to magnetic resonance imaging.

BACKGROUND

Spin-echo sequences, gradient-echo pulse sequences, and their hybrid are commonly used for data acquisition in magnetic resonance imaging (MRI). The stimulated-echo (STE) pulse sequence is often used to investigate the transport phenomena, such as molecular translational diffusion and displacement-encoded imaging (DENSE). STE is also used in localized single-voxel spectroscopy for studying short $T_2$ species. In STE imaging, half of the prepared magnetization is restored into the longitudinal space by a second 90° RF (tipup) pulse, and other half of the prepared magnetization, which remains on the transverse plane after the tipup RF pulse, is discarded. This results in wasting of a quadrature component of the magnetization and quadruples the acquisition time to achieve a signal-to-noise ratio (SNR) comparable to spin-echo MRI. Considering the low sensitivity of NMR measurements, stimulated echo NMR/MRI is an inefficient measurement technique.

SUMMARY

The disclosure provides echo planar imaging (EPI) based singleshot imaging techniques for acquiring spin-EPI (SEPI) and stimulated-EPI after a single RF excitation. In certain embodiments, the techniques uses half of the prepared magnetization that is discarded in conventional stimulated echo imaging to acquire the SEPI. Because the SEPI and STEPI are acquired substantially simultaneously, the SEPI and STEPI can be used to perform quantitative analysis (e.g., $T_1$ estimation) in realtime that is free from motion-related artifacts.

In certain embodiments, the SEPI and STEPI acquired in a singleshot are used to compute a $T_1$ map within the imaging field of view (FOV) in realtime. Because the SEPI and STEPI are acquired in a singleshot, the $T_1$ map is free from motion-related artifacts. In certain embodiments, the $T_1$ map is used for realtime monitoring of concentrations of paramagnetic-ion based contrast agent in dynamic contrast enhanced MRI.

In certain embodiments, the STEPI is modified to correct for inhomogeneity in the $B_1$ field. This is done by acquiring a STEPI with minimum mixing time (TM) and generating a $B_1$ correction map using the STEPI acquired with minimum TM and the SEPI. The STEPI is then modified based on the $B_1$ correction map to correct for $B_1$ field inhomogeneity. This correction enables accurate quantitative analysis using the SEPI and STEP that is free from error due to $B_1$ field inhomogeneity.

In certain embodiments, a gradient-EPI (GEPI) is also acquired after the single RF excitation providing singleshot SEPI, GEPI and STEPI acquisition. In certain embodiments, the phase difference between the SEPI and GEPI is used to compute temperature-dependent chemical shift in a subject in realtime. The temperature-dependent chemical shift can be used to monitor temperature changes in the subject in realtime. For example, realtime monitoring of temperature changes can be used in a heat treatment to control the dosage of heat energy during the heat treatment.

Additional features and advantages of the invention will be set forth in the description below, and in part will be apparent from the description, or may be learned by practice of the invention. The advantages of the invention will be realized and attained by the structure particularly pointed out in the written description and claims hereof as well as the appended drawings.

It is to be understood that both the foregoing summary of the invention and the following detailed description are exemplary and explanatory and are intended to provide further explanation of the invention as claimed.

BRIEF DESCRIPTION OF THE DRAWINGS

The accompanying drawings, which are included to provide further understanding of the invention and are incorporated in and constitute a part of this specification, illustrate aspects of the invention and together with the description serve to explain the principles of the invention.

DETAILED DESCRIPTION

Figure 1:
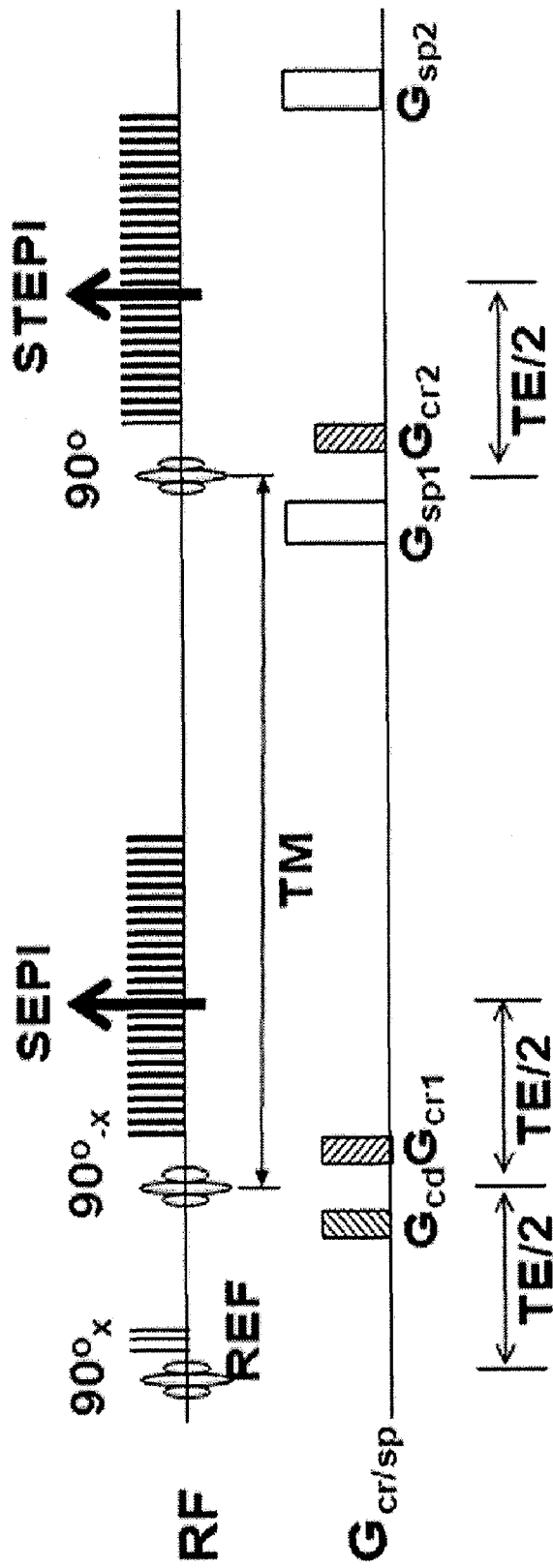
FIG. 1 shows a pulse sequence diagram for acquiring a singleshot SEPI and STEPI (2D ss-SESTEPI) according to an embodiment of the invention.

FIG. 1 shows a pulse sequence diagram for acquiring a singleshot SEPI and STEPI (2D ss-SESTEPI) according to an embodiment of the invention. The diagram in FIG. 1 shows both RF pulses and data acquisition windows of the MR signal. $G_{cr}$ and $G_{sp}$ indicate the gradient pulses for the crusher and the spoiler, respectively. Both spin-echo and stimulated-echo are formed at the same TE, where the effect from the field inhomogeniety is removed and the $T_2$ decay time is the same.

Referring to FIG. 1, a first $90°_x$ RF pulse is applied to excite an initial transverse magnetization. Three reference echoes are acquired immediately after the first $90°_x$ RF pulse for EPI phase-correction. The transverse magnetization excited by the first RF pulse is dephased by the dephasing crusher $G_{cd}$, and then split into two quadrature components $M_I$ and $M_Q$ with equal magnitudes by a perfect tipup $90°_{-x}$ RF pulse. The in-phase (I) magnetization $M_I$ component is rephased by the rephasing crusher $G_{cr1}$, and a spin-echo is formed at position "SEPI." After SEPI acquisition, the $M_I$ magnetization is spoiled by $G_{sp1}$. The $M_I$ magnetization is given as follows:

$$M_+^I(\vec{r}) = \frac{1}{2} M_+^0(\vec{r}) \cdot e^{-TE/T_2} \quad (1)$$

where $\vec{r}$ is a position vector, and $M_+^0(\vec{r})$ is the initial transverse magnetization at position $\vec{r}$. The "+" notation indicates transverse magnetization.

The Quadrature (Q) magnetization component is stored in the longitudinal space during the mixing time TM, during which time the fresh longitudinal magnetization is also recovered. The longitudinal magnetization just before a third RF pulse is the sum of $T_1$ decayed prepared magnetization and freshly recovered magnetization during the mixing time TM. The longitudinal magnetization is given as follows:

$$M_z(\vec{r}, TM) = M_0(\vec{r})(1 - e^{-TM/T_1}) + \frac{1}{2} M_+^0(\vec{r}) \cdot e^{-TM/T_1} \quad (2)$$

where $M_z(\vec{r}, TM)$ is the longitudinal magnetization, the first term represents the freshly recovered magnetization and the second term represents the prepared magnetization. The "z" notation indicates longitudinal magnetization.

The third 90° RF pulse tips this longitudinal magnetization down to the transverse plane. $G_{cr2}$ rephases only the prepared magnetization previously dephased by $G_{cd}$, while spoiling the freshly recovered magnetization as well as all other spin-echoes that are mirrored by the third 90° RF pulse. The stimulated echo is formed at the position "STEPI," where the center of phase-encoding ($k_y=0$) is also positioned. Therefore, the STEPI signal is only from the purely prepared magnetization, without being contaminated by the fresh magnetization. The prepared magnetization at the position "STEPI" is given by:

$$M_+^Q(\vec{r}) = \frac{1}{2} M_+^0(\vec{r}) \cdot e^{-TE/T_2} \cdot e^{-TM/T_1} \quad (3)$$

where $M_+^Q(\vec{r})$ is the prepared magnetization, which corresponds to the Q magnetization component after the initial transverse magnetization is split into the I and Q magnetization components.

Thus, the pulse sequence in FIG. 1 acquires a SEPI at position "SEPI" and a STEPI at position "STEPI" in a single-shot following the same RF excitation. The two EPI images may have the same resolution and spatial dimensions. Further, the two EPI images are acquired substantially simultaneously with different $T_1$ decay time. For perfect 90° pulses, half the initial magnetization is stored in the longitudinal space and the other half remains in the transverse plane after the tipup 90° RF pulse. The magnetization remaining in the transverse plane is used for the SEPI and the magnetization stored in the longitudinal space is used for the STEPI. Crusher gradient $G_{cr2}$ selectively rephases the prepared magnetization, while spoiling the fresh longitudinal magnetization that recovers during TM.

The pulse sequence after the initial transverse magnetization is split into the quadrature components $M_I$ and $M_Q$ with equal magnitudes by a perfect tipup $90°_{-x}$ RF pulse (second RF pulse), may be summarized as follows:

(1) $M_I$ component is rephased by rephasing crusher $G_{cr1}$, and refocused at the spin-echo position "SEPI."

(2) $M_I$ is spoiled by $G_{sp1}$ after SEPI acquisition.

(3) During the mixing time TM, the $M_Q$ component undergoes $T_1$ decay and is mixed with the freshly recovered longitudinal magnetization.

(4) The third 90° RF pulse tips the longitudinal magnetization down to the transverse plane, which is the sum of $T_1$ decayed stored magnetization and the freshly recovered magnetization.

(5) $G_{cr2}$ rephases only prepared magnetization previously dephased by $G_{cd}$, while spoiling the freshly recovered magnetization.

(6) The stimulated echo is formed at the position "STEPI," where the center of phase-encoding $k_y$ is also positioned.

Assuming perfect 90° RF pulses, the magnetizations for the SEPI and the STEPI are given by:

$$M_{SE}(\vec{r}) = \frac{1}{2} M_+^0(\vec{r}) \cdot e^{-TE/T_2} \quad (4)$$

$$M_{STE}(\vec{r}) = \frac{1}{2} M_+^0(\vec{r}) \cdot e^{-TE/T_2} \cdot e^{-TM/T_1} \quad (5)$$

For the ideal case of perfect 90° RF pulses, the magnetizations for the SEPI and the STEPI only differ by the $T_1$ decay ($e^{-TM/t_1}$).

However, the fliangles of the RF pulses deviate from the perfect 90° RF pulses due to $B_1$ field inhomogeneity. The effect of to $B_1$ field inhomogeneity has to be taken into account to accurately compute $T_1$. The magnetizations for the SEPI and STEPI may be modified as follows to include the effect from spatial variation of the $B_1$ field:

$$M_{SE}(\vec{r}) = f_I(\vec{r}) \cdot \frac{1}{2} M_+^0(\vec{r}) \cdot e^{-TE/T_2} \quad (6)$$

$$M_{STE}(\vec{r}) = f_Q(\vec{r}) \cdot \frac{1}{2} M_+^0(\vec{r}) \cdot e^{-TE/T_2} \cdot e^{-TM/T_1} \quad (7)$$

$$= g(\vec{r}) \cdot M_{STE}(\vec{r}) \cdot e^{-TM/T_1}$$

where $f_I(\vec{r})$ and $f_Q(\vec{r})$ are position-dependent fractions for spin-echo and stimulated-echo, respectively, and $g(\vec{r})$ is defined as $g(\vec{r})=f_Q(\vec{r})/f_I(\vec{r})$. Because the effect in the flipangle deviation of the first RF is identical for both SEPI and STEPI, the RF functions $f_I(\vec{r})$ and $f_Q(\vec{r})$ are caused by $B_1$ field distribution of the second and third RF pulses. Note that $f_I(\vec{r})$ and $f_Q(\vec{r})$ are smoothly varying and position dependent functions. It is necessary to obtain a map of these $B_1$ functions to use the magnitude images of SEPI and STEPI for quantitative analysis, such as $T_1$ or diffusion measurement.

Assuming the actual flipangle $\alpha$ for the second and third RF pulses are a at position $\vec{r}$, Eqs. 5 and 6 for the magnetization components measured at SE and STE are given as $$M_{SE}(\vec{r}) = M_+^0(\vec{r}) \sin^2 \frac{\alpha}{2} \cdot e^{-TE/T_2} \quad (8)$$

-continued $$M_{STE}(\vec{r}) = \frac{1}{2}M_+^0(\vec{r})\sin^2\alpha \cdot e^{-TE/T_2} \cdot e^{-TM/T_1} \quad (9)$$
$$= g(\vec{r}) \cdot M_{STE}(\vec{r}) \cdot e^{-TM/T_1}$$

Here, $g(\vec{r})$ indicates the error in magnitude from the case with the perfect 90° RF due to $B_1$ inhomogeneity. For perfect 90° RF pulses, Eqs. 8 and 9 become the same as Eqs. 4 and 5 respectively. From these two equations, the theoretical $B_1$ correction function $g(\vec{r})$ is obtained as follows $$g(\vec{r}) = \frac{\sin^2\beta}{2\sin^2\frac{\alpha}{2}} = 2\cos^2\frac{\alpha}{2} \quad (10)$$

The measured spin-relaxation time $T_1^{meas}$ of the measurement without $B_1$ correction can be given as follows:

$$T_1^{meas} = \left\{\frac{\ln S_{SE}(\vec{r}) - \ln S_{STE}(\vec{r})}{TM}\right\}^{-1} = \left\{\frac{1}{T_1^{true}} - \frac{1}{TM}\left(2\cos^2\frac{\alpha}{2}\right)\right\}^{-1} \quad (11)$$

where $T_1^{meas}$ is the measured $T_1$ and $T_1^{true}$ is the true $T_1$, ln is a natural log function and $S_{SE}$ and $S_{STE}$ are the signal intensities of the SEPI and STEPI, respectively. Eq. 11 indicates that the error in measured $T_1$ will differ for different mixing times as well as different actual flipangle. Eq. 11 is only for the transmit function without including the difference in signal reception.

Figure 2:
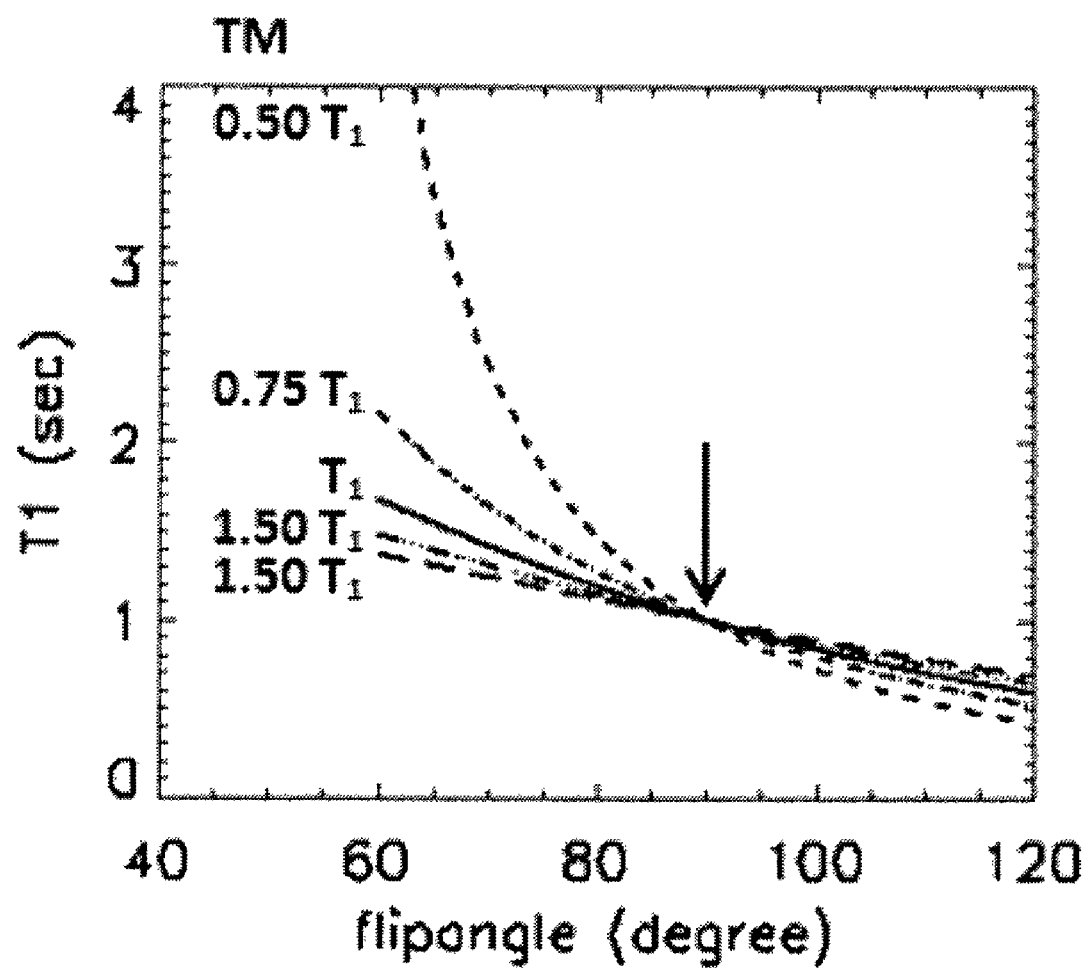
FIG. 2 shows a plot of estimated $T_1$ without $B_1$ correction for different flipangles and mixing times.

Eq. 11 was used to simulate the expected error on the $T_1$ estimation with respect to the mixing time and actual flipangle. One second was used as the true $T_1$ in the simulation. FIG. 2 shows a plot of estimated $T_1$ without $B_1$ correction for different flipangles and mixing times TM=0.50, 0.75, 1.0, 1.25 and 1.5 $T_1$ from top to bottom. $T_1$ tends to be prolonged with smaller flipangle than 90° and short mixing time TM, while it is decreased with larger flipangle and mixing time TM. As indicated in Eq. 11, the estimated $T_1$ agrees with the true $T_1$ for perfect 90° flipangle, as indicated by vertical arrow.

Figure 3:
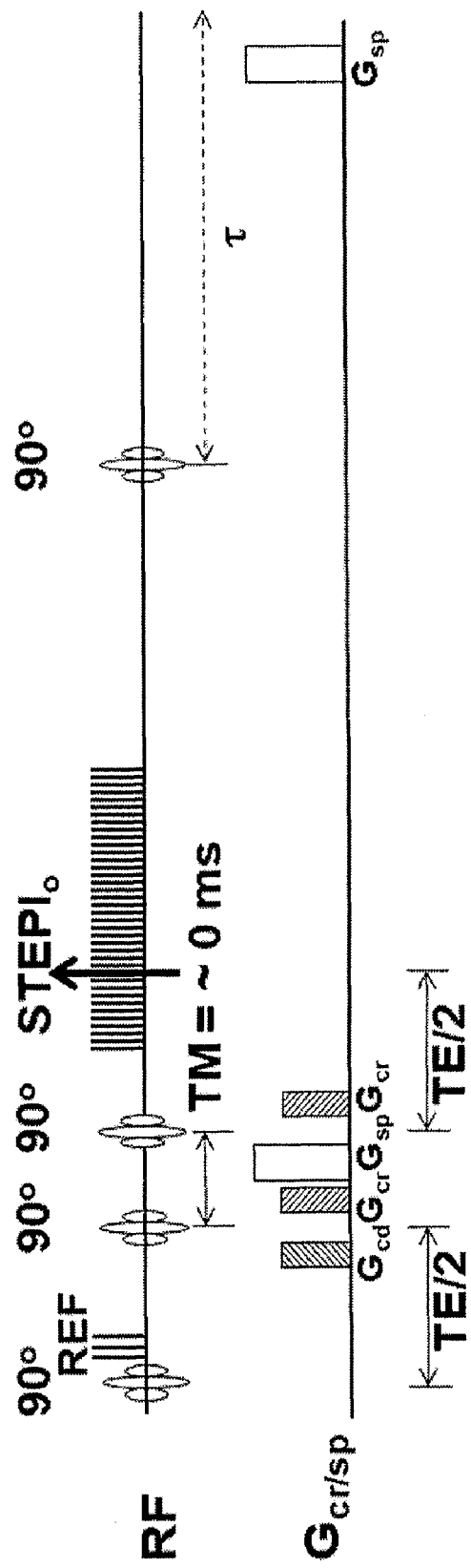
FIG. 3 shows a pulse sequence diagram for acquiring SEPI with minimum mixing time according to an embodiment of the invention.

It is not necessary to accurately measure the actual position-dependent flipangle $\alpha(\vec{r})$ in order to correct for $B_1$ field inhomogeniety. Any difference between SEPI and STEPI with when the mixing time TM approaches zero (i.e., no or negligible $T_1$ decay in STEPI) is directly related to the $B_1$ correction function. STEPI with TM approaching zero is denoted $STEPI_0$. Therefore, the correction function $g(\vec{r})$ can be experimentally measured as a part of the data acquisition by setting the mixing time TM→0. FIG. 3 shows a pulse sequence in which the data acquisition window for SEPI is removed to acquire the $STEPI_o$ image with minimal mixing time (TM~0). In practice, the minimal TM is about 5 ms and the $T_1$ decay for typical $T_1$ at 3 T is less than 1%. The $B_1$ correction map $g(\vec{r})$ is then obtained by dividing $STEPI_o$ by $SEPI_o$ as follows:

$$g(\vec{r}) = \frac{f_Q(\vec{r})}{f_I(\vec{r})} = \frac{STEPI_0}{SEPI_0} \quad (12)$$

where $STEPI_o$ is acquired using the pulse sequence in FIG. 3 with minimum TM and $SEPI_o$ may be the same as the SEPI acquired using 2D ss-SESPTEPI. In the pulse sequence shown in FIG. 3, STEPI is acquired after three 90° RF pulses with the minimum mixing time TM to remove the $T_1$ decay. A fourth 90° RF pulse is applied after $STEPI_o$ to achieve exactly the same recovery time as that of ss-SESTEPI.

The $B_1$ correction function $g(\vec{r})$ may be computed for each position $\vec{r}$ or pixel within the imaging FOV by dividing $STEPI_o$ by $SEPI_o$ pixel-by-pixel. The inverse correction map $g^{-1}(\vec{r})$ may then be multiplied by the STEPI signal pixel-by-pixel to remove the difference caused by $B_1$ inhomogeneity. This eliminates error in the resultant quantification that is caused by the inhomogeneous $B_1$ field.

In practice, $STEPI_o$ is measured only once by pre-imaging with increased signal averaging. The same number of averages may be used for $STEPI_o$ and $SEPI_o$ for the $B_1$ correction function $g(\vec{r})$. $SEPI_o$ is the average SEPI from pre-dynamic images and is not measured separately. Two to four magnitude averaging may be used for $STEPI_o$ and $SEPI_o$. It is worth noting that no change in $T_1$ should be induced during $B_1$ correction mapping acquisition, i.e., $2*N_{avgs}$, where $N_{avgs}$ indicates the number of average for $B_1$ correction mapping.

The STEPI corrected for $B_1$ inhomogeneity may then be used to accurately compute a $T_1$ map for the positions $\vec{r}$ or pixels within the imaging FOV. The $T_1$ map may be determine by computing the logarithm of the signal intensities of the SEPI and the $B_1$ corrected STEPI and performing linear fitting on the logarithms assuming the SEPI and the $B_1$ corrected STEPI differ by the $T_1$ decay ($e^{-TM/T_1}$). The $B_1$ correction may be applied to the SEPI instead. Since the SEPI and STEPI are acquired in a singleshot, the $T_1$ map can be computed in substantially realtime and is free from motion-related artifacts.

The realtime $T_1$ map can be used to monitor concentrations of contrast agents in dynamic contrast enhanced MRI. For example, the concentration of paramagnetic-ion based contrast agents are approximately linearly related to $T_1$ allowing the concentrations of these contrast agents in the patient to be accurately monitored in realtime using the $T_1$ map.

The 2D ss-SESTEPI may also be used to measure the phase-change between SEPI and STEPI. As mentioned previously, both echoes are formed at the same TE and therefore, they are supposed to have the same phase map. The pulse sequence can easily be modified to encode the displacement of an imaging voxel during the mixing time by adjusting the zeroth moment of the crusher gradient. The spatial distribution of this phase may be used to extract the displacement and the average velocity during TM, and change of local magnetic field during the mixing time. Unlike multishot imaging for which imaging phase is mixed with pseudo-random phase error caused by the physiological motion, SEPI and STEPI share the identical phase-error and their difference must be insensitive to the phase-error.

Figure 4:
FIG. 4 shows a pulse sequence diagram for acquiring a singleshot SEPI, GEPI and STEPI (2D ss-SGSTEPI) according to an embodiment of the invention.

FIG. 4 shows a pulse sequence diagram for acquiring a GEPI in addition to the SEPI and the STEPI in a singleshot according to an embodiment of the invention. The diagram in FIG. 4 is similar to the pulse sequence in FIG. 1 with the addition of GEPI acquisition. In this embodiment, the GEPI is acquired following SEPI acquisition using the transverse magnetization $M_T$. The transverse magnetization is further dephased and forms a gradient echo at the position "GEPI." The phase difference between GEPI and SEPI can be used to estimate the local field variation, as discussed further below. The SEPI and STEPI acquisitions are the same as before.

After completion of SEPI measurement, all imaging gradients are rewound. The transverse magnetization is further evolved with $T_2^*$ decay by $e^{-\Delta TE/T_2^*}$ and the GEPI is measured, as indicated by "GEPI" in FIG. 4. The GEPI provides the information about phase-accumulation during $\Delta TE$ caused by local field variation, such as by change of chemical shift or susceptibility field. Therefore, the phase difference between SEPI and GEPI can be used to estimate the variation in $B_o$ field induced by, for instance, temperature-dependent chemical shift.

In this embodiment, a pair of magnitude and phase measurements are acquired for each of the SEPI, GEPI, and STEPI. Thus, three pairs of magnitude and phase images are acquired in a singleshot enabling simultaneous measurement of $T_1$ and phase difference. The SEPI and STEPI have the same TE but different $T_1$ decay, while the SEPI and GEPI have different $T_2^*$ decay and phase with the same $T_1$ weighting. The signal intensity of the GEPI becomes:

$$S_{GRE}(\vec{r}) = S_{SE}(\vec{r}) \cdot e^{-\frac{\Delta TE}{T_2^*}} \quad (13)$$

where $S_{GRE}(\vec{r})$ and $S_{SE}(\vec{r})$ are the signal intensities of the GEPI and SEPI, respectively.

The phase difference between SEPI and STEPI can be used to compute temperature-dependent chemical shift (e.g., of water proton) as follows:

$$\Delta \sigma_{ppm} = \frac{\theta_{GRE} - \theta_{SE}}{2\pi \cdot \Delta TE} \cdot \frac{1}{\gamma B_o} \quad (14)$$

where $\Delta\sigma_{ppm}$ is the temperature-dependent chemical shift in parts per million, $\theta_{GRE}$ and $\theta_{SE}$ are the phases of the GEPI and SEPI, respectively, $B_0$ is the main field of the MRI (e.g., 3.0 T) and $\gamma$ is the gyromagnetic ratio. The term $\gamma B_0$ represents an MRI frequency and the term $$\frac{\theta_{GRE} - \theta_{SE}}{2\pi \cdot \Delta TE}$$

represents a frequency distribution based on the phase difference between the GEPI and SEPI. Since $B_0$ and $\gamma$ are known, Eq. 14 can be used to compute the temperature-dependent chemical shift in realtime based on the phase difference between SEPI and GEPI. Eq. 14 can also be used to determine the local variation in the magnetic field due to the chemical shift by multiplying the chemical shift by the field $B_0$. Eq. (14) can be used to compute a chemical shift distribution for the positions $\vec{r}$ or pixels within the imaging FOV by determining the phase difference between SEPI and GEPI pixel-by-pixel and using Eq. (14) to compute the chemical shift for each position $\vec{r}$ or pixel.

The computed chemical shift can then be used to determine changes in temperature within a patient. Because the SEPI and GEPI are acquired in a singleshot, the chemical shift and therefore the temperature change can be monitored in realtime. Realtime temperature monitoring may be used in a heat treatment to control the dosage of heat energy during the heat treatment. For example, realtime temperature monitoring can be used in high intensity ultrasound (HIFU) treatments to monitor the temperature of normal tissue surrounding a tumor being ablated to make sure that the temperature of the normal tissue does not exceed a threshold, thereby avoiding heat damage.

Thus, the novel 2D ss-SGSTEPI imaging technique according to embodiments of the invention provides for simultaneous acquisitions of spin-/gradient-/stimulated-EP images (SEPI, GEPI, STEPI) of localized volumes. Unlike the conventional stimulated-echo imaging techniques which discard half the magnetization, all prepared magnetization is measured to produce three EP images in 2D ss-SGSTEPI.

Because the SEPI, GEPI and STEPI are acquired in a singleshot after a single excitation according to embodiments of the invention, they are free from motion-related error. The technique can be used to measure $T_1$ and phase in a singleshot. One immediate application of the singleshot $T_1$ mapping is to determine the concentration of paramagnetic-ion (such as gadolinium) based contrast agent for studying pharmacokinetics in drug-development research and for evaluation of perfusion kinetics in cancer imaging. Using the imaging technique, $T_1$ and phase-difference maps can be achieved almost in realtime and concentration of the paramagnetic-ion based contrast agent can be accurately obtained to evaluate tumor physiology and tumor response to, for example, heat ablation.

MRI Experiments

MRI studies were performed on a Siemens Trio 3 Tesla MRI system (Siemens Medical Solutions, Erlangen, Germany) with Avanto gradients (45 mT/m strength and 150 T/m/s slew rate). The pulse sequence was developed based on a singleshot spin-echo EPI sequence, using the IDEA pulse sequence development environment. Realtime calculation of $T_1$ mapping was implemented into a custom-made ICE program (Image Construction Environment). The image construction program produced two magnitude images, two phase images, and a $T_1$ map for each slice.

A phantom was constructed with four 20 cc plastic bottles filled with 0.05, 0.1, 0.2, and 0.4 mM $MnCl_2$/water solutions, respectively, and immersed in jello in a rectangular acrylic container with dimensions $8\times8\times13$ cm$^3$. The $T_1$ of each concentration was 1.3, 0.9, 0.55, 0.35 sec for 0.05, 0.1, 0.2, 0.4 mM, respectively. $T_1$ of the phantom was measured using saturation-recovery spin-echo.

The MRI experiment was performed to investigate the effect of flipangle and mixing time TM for $B_1$ correction mapping on the accuracy of $T_1$ measurement, using $128\times32$ imaging matrix with 62.5% phase-encoding asymmetry, $2\times2\times2$ mm$^3$ spatial resolution, 1.39 kHz/pixel receiver bandwidth, and TR=5.0 s, using a transmit/receive head RF coil. The echo times were 15 ms for both SEPI and STEPI.

2D ss-SESTEPI was applied to in-vivo dynamic $T_1$ mapping MRI to measure in realtime the $T_1$ map of two tumor-bearing female nude mice (15), using a home-made quadrature transmit/receive saddle coil with 1.5 inch inner-diameter and 3 inch length and imaging parameters: in-plane resolution of $1\times1$ mm$^2$ with 2 mm slice thickness, $128\times32$ imaging matrix, 5.0 s TR, 120 total repetitions (time frames) for 10 min, TEs=15 msec for both SEPI and STEPI. The first 4 measurements were used to acquire STEPI$_o$ images for $B_1$ correction mapping. $T_1$ maps were constructed from the time frame 5. In this application for realtime concentration mapping in DMT-MRI, contrast agent was administered after 8 repetitions, i.e., acquisitions of four STEPI$_o$ and four pre-contrast imaging. Multi-Hance (Gadobenate dimeglumine: Gd-BOPTA, Bracco Diagnostics, Inc.) was injected via the catheterized tail vein to a dose of 0.1 mM Gd/kg. Animals were cared for under the guidelines of a protocol approved by the University of Utah Institutional Animal Care and Use Committee.

Results of the MRI experiment are discussed below.

$B_1$ Correction Process

Figure 5:
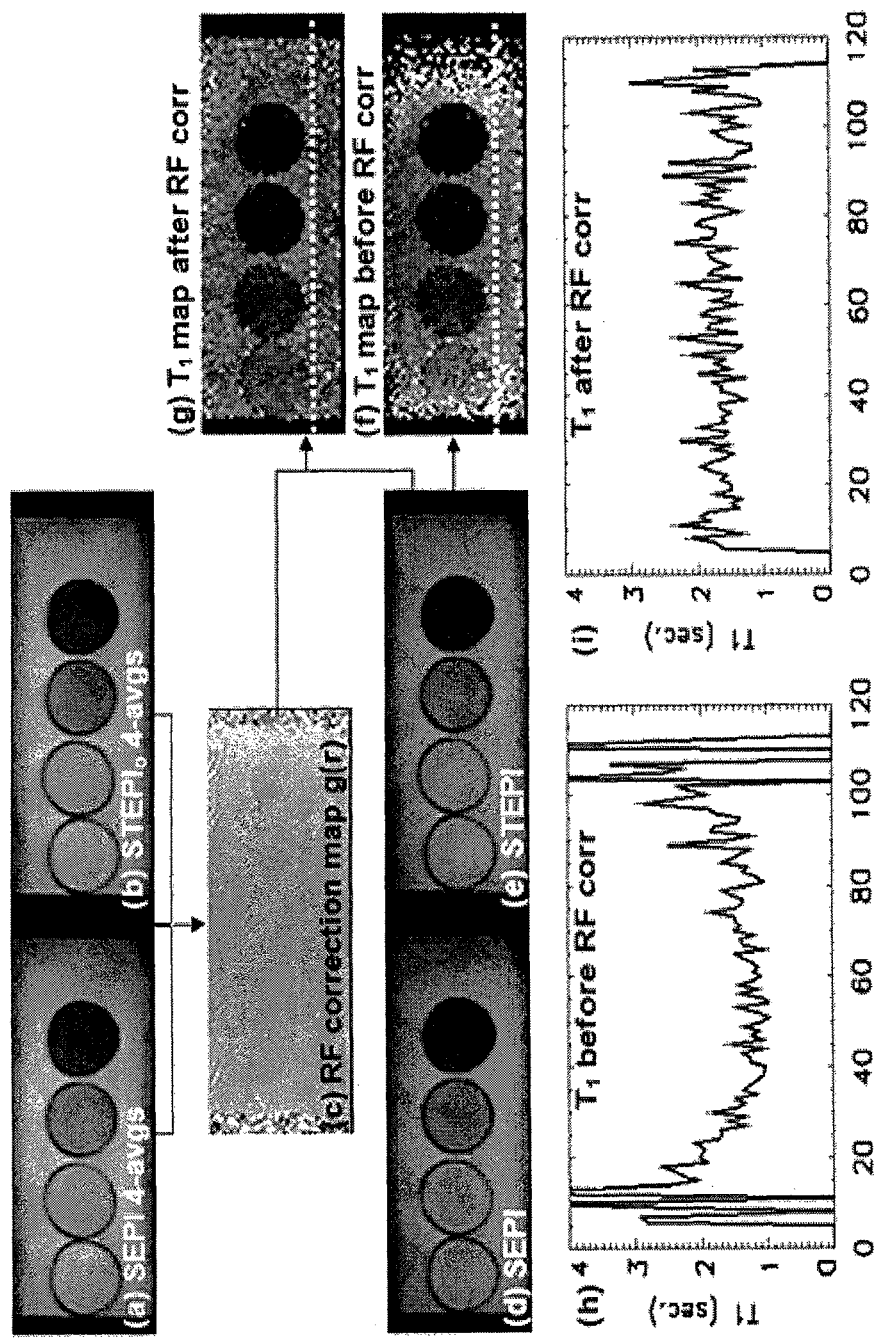
FIG. 5 illustrates experimental results for a $B_1$ correction process according to an embodiment of the invention.

A MRI experiment was performed to demonstrate the accuracy of $T_1$ maps with respect to flipangle, mixing time TM, and number of averages for $B_1$ correction map. A phantom was constructed with 4 plastic bottles filled with $MnCl_2$/water solutions with concentrations of 0.05, 0.1, 0.2, and 0.4 mM, which were surrounded by jello. $T_1$ mapping experiment was conducted using inversion-recovery spin-echo (IR-SE) imaging and 2D ss-SGSTEPI. $T_1$ of each concentration of $MnCl_2$/water solution were measured as 1.5, 0.89, 0.55, 0.35 sec for 0.05, 0.1, 0.2, 0.5 mM, respectively. FIG. 5 shows the $T_1$ calculation process for 4-averaged magnitude images (SEPI and $STEPI_0$) in (a) and (b), respectively, for the $B_1$ correction map. FIG. 5 also shows the $B_1$ correction map $g(\vec{r})$ in (c), and single average singleshot images (SEPI) and (STEPI) in (d) and (e), respectively. FIG. 5 also shows the $T_1$ maps before and after $B_1$ correction in (f) and (g), respectively.

The $T_1$ map (g) after $B_1$ correction indicates remarkable improvement in uniformity compared to that before correction in (f). $T_1$ values measured using 2D ss-SGSTEPI agree very well with those measured using IR-SE, of which $T_1$ for 0.1 and 0.2 mM are compared in FIG. 6(a). $T_1$ values along the horizontal dotted lines on $T_1$ maps before and after corrections are plotted in (h) and (i), respectively, of FIG. 5. The $T_1$ map (g) and plot (i) clearly indicate substantial improvement by $B_1$ inhomogeneity correction.

Referring to FIG. 5, the $B_1$ correction process is summarized as follows: four averaged (a) SEPI and (b) $STEPI_o$ images were used to calculate (c) the $B_1$ correction map, which is used to correct the singleshot (d) SEPI and (e) STEPI. The $T_1$ maps before and after $B_1$ correction are shown in (f) and (g), respectively. $T_1$ values of jello along the horizontal dotted lines in the water proton are presented in plots (h) and (i) for before and after $B_1$ correction, respectively. The $T_1$ map (g) and plot (i) clearly show substantial improvement as a result of $B_1$ inhomogeneity correction.

Flip Angle Variation 2D ss-SESTEPI was applied to investigate the effects of flip angle variation on the resultant $T_1$ value. A $T_1$ map was acquired using 2D ss-SESTEPI with nominal flip angles 60, 75, 90, 105, and 120° for the second and third RF pulses in FIG. 1, using a 0.4 sec mixing time, and four-averaged $B_1$ correction map.

Figure 6:
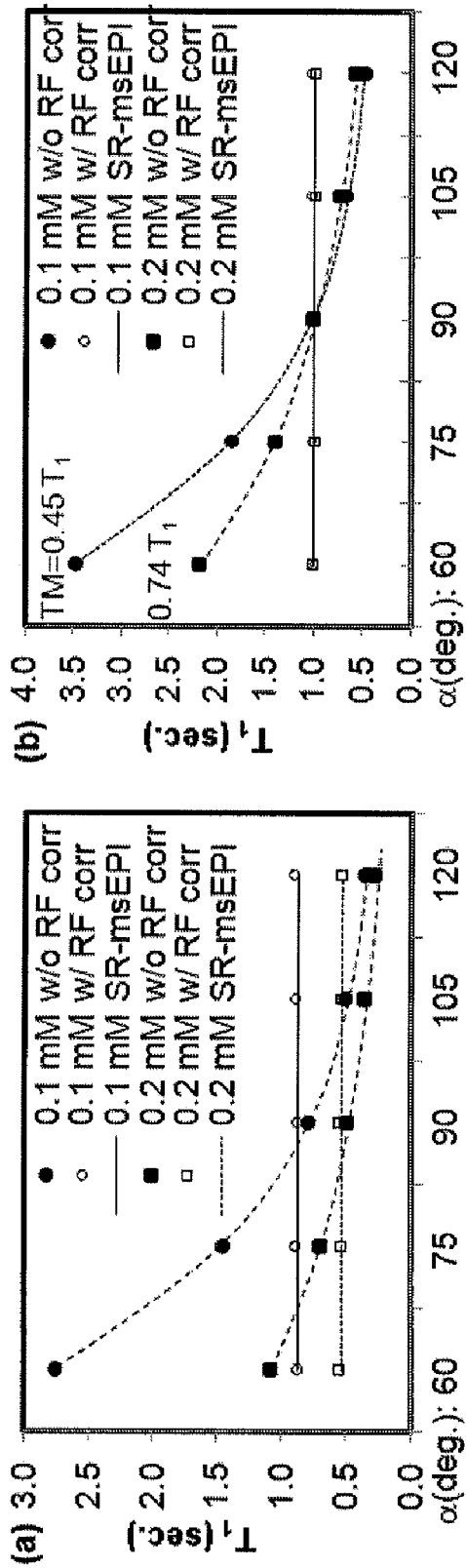
FIG. 6 shows plots of the effects of flip angle variation on $T_1$ measurements according to an embodiment of the invention.

Mean $T_1$ values on regions-of-interest (ROIs) of 0.1 and 0.2 mM solutions are plotted in (a) and (b) of FIG. 6. Closed and open symbols represent $T_1$ measurements before and after $B_1$ correction, respectively and circles and square symbols indicate 0.1 and 0.2 mM $MnCl_2$ concentrations, respectively. Dotted and broken lines are guidelines to the $T_1$ plots without $B_1$ correction. Solid horizontal lines indicate $T_1$ values measured using SR-SE imaging. These experiments demonstrated significant improvement in accuracy by $B_1$ correction for all values of $T_1$ (0.2~1.3 sec.). Plots in (b) are $T_1$ values in (a) normalized to $T_1=1.0$ s to compare the empirical data to the simulated plot in FIG. 3. A TM of 0.4 s corresponds to 0.45 $T_1$ for $T_1=0.89$ s and 0.74 $T_1$ for $T_1=0.55$ s for 0.1 and 0.2 mM $MnCl_2$ concentrations, respectively.

Plots in (b) of FIG. 6 show good agreement with the theoretical simulation in FIG. 2 and robustness of the $B_1$ inhomogeneity correction. In the $B_1$ correction, no modeling or user-defined input is used. Therefore, the resultant measurement is free from any user-dependent bias. SNR is the key element to determine the accuracy of the measurement. Considering that the measurement was made in a singleshot scan with a few seconds acquisition time, the accuracy of the $T_1$ measurement may be considered remarkable.

Referring to FIG. 6, the results for flip angle variation are summarized as follows: $T_1$ measurement before and after $B_1$ correction are indicted by (●,■) and (○, □), respectively. The data in (a) are actually measured $T_1$ values, and those in (b) were normalized $T_1$ to 1.0 s to compare with the theoretical plots in FIG. 2. Dotted and broken lines indicate guidelines. Horizontal solid-lines represent $T_1$ using spin-echo MRI.

TM Variation

Figure 7:
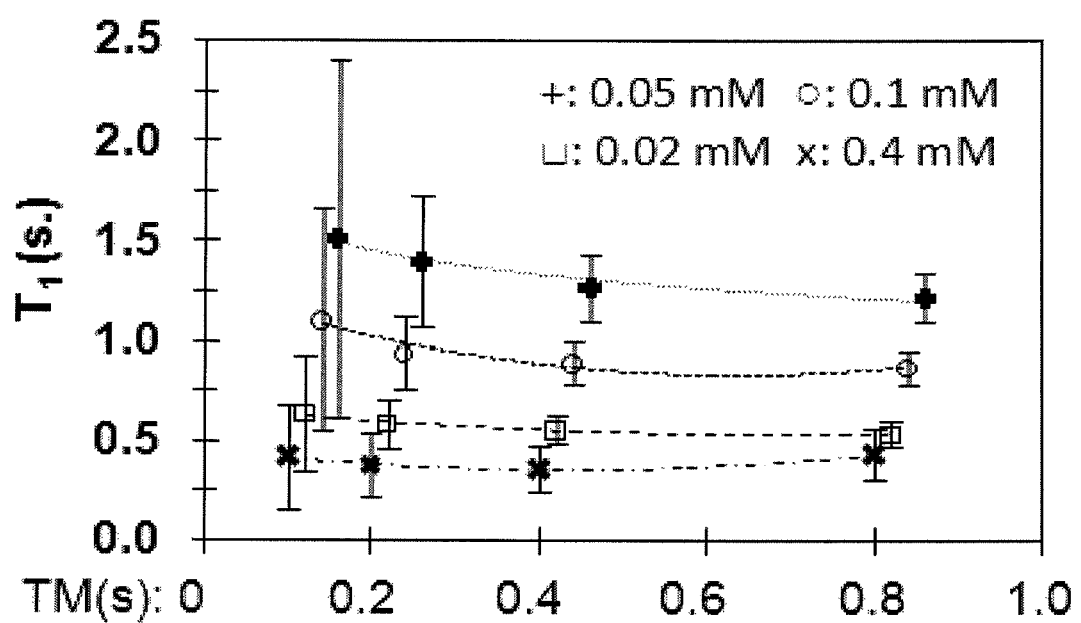
FIG. 7 shows plots of the effects of mixing time (TM) variation on $T_1$ measurements according to an embodiment of the invention.

To accurately measure $T_1$ decay using two signal intensities, the signal difference between SEPI and STEPI must be significantly larger than the noise amplitude, otherwise the resultant measurement will be dominated by noise, rather than $T_1$ decayed signal change. The $T_1$ map was acquired using 2D ss-SESTEPI with a nominal flip angle of 90° and a four-averaged $B_1$ correction map for variable mixing times TM=0.1, 0.2, 0.4, and 0.8 sec. The mean and standard deviation were measured on ROIs selected on each concentration and plotted with respect to the mixing time in FIG. 7. Error bars on the plots indicate the standard deviation of each measurement.

These plots indicate that the uncertainty of the measurements greatly depends on the selection of TM. $T_1$ measurement using the increased TM produces increased accuracy and reduced errors; however, it limits the number of slices in an interleaved multi-slice scan. For $T_1$ below 1.0 sec, the difference in uncertainty for measurements with 0.4 sec and 0.8 sec TM is not significant.

In-Vivo Measurement of Singleshot $T_1$ of a Mouse

To demonstrate the performance of 2D ss-SGSTEPI in in-vivo application, the technique was used to acquire, (1) dynamic $T_1$ mapping in DCE-MRI on two tumor-bearing mice, and (2) rapid $T_1$ mapping of human brain. To increase the SNR, a dedicated transmit/receive mouse RF coil was developed and used for mice MRI experiment.

Because typical clinical RF coil is over-coupled to accommodate the wide range of imaging subject, SNR of the resultant images are relatively low. A transmit/receive quadrature volume RF coil with interface (T/R switch, preamplifier, quadrature hybrid mixer/splitter, and coil selector switch) was developed for imaging of mice at 3T wholebody clinical MRI system. The dimension of this coil was 1.5" inner diameter and 3" length to image mice and small rats. FIG. 8(a) shows the coil assembly and 8(b) shows the coil-interface.

Using this RF probe, SNR was improved 3 times for the same imaging protocol, compared to that using Siemens wrist RF coil. This corresponds to 9 times efficiency in imaging time. Images (c) and (d) in FIG. 8 are 3D gradient-echo images of pre- and post-contrast, respectively, after Gd-chelate injection with $(0.4 \text{ mm})^3$ isotropic resolution acquired in 1.5 min imaging time.

Figure 8:
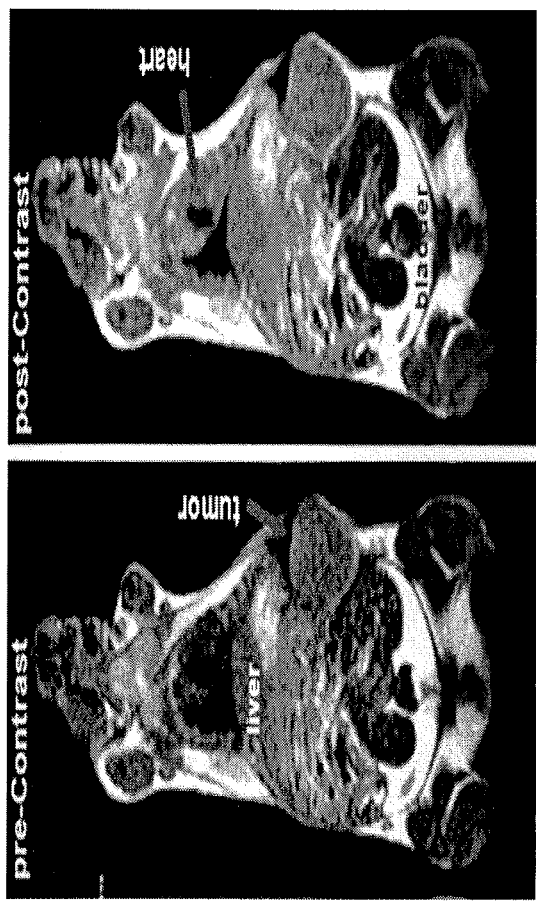
FIG. 8 shows a coil assembly, a coil interface and gradient-echo images according to an embodiment of the invention.
Figure 8:
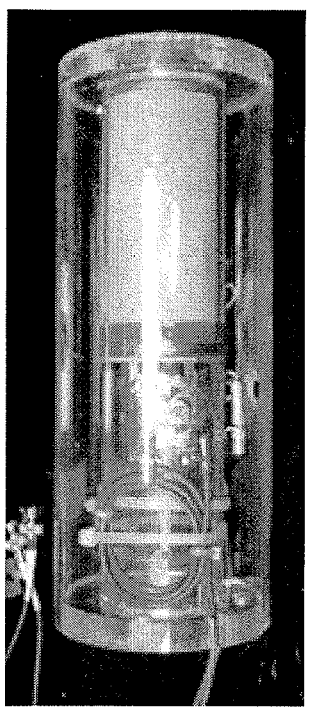
Figure 8:
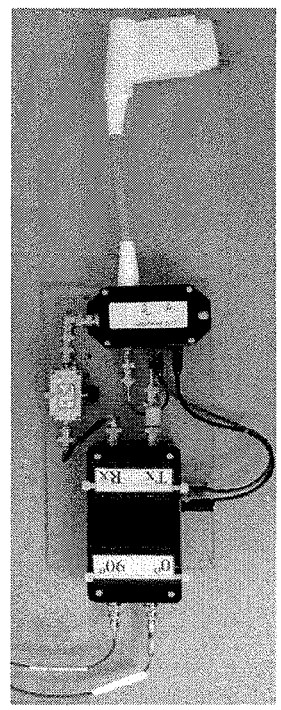

In-Vivo Dynamic $T_1$ mapping (DTM) of Tumor-Bearing Mice 2D ss-SGSTEPI was applied to measure dynamic $T_1$ maps from two in-vivo tumor-bearing mice, using the coil in FIG. 8 and imaging parameters of in-plane resolution of $1\times1$ mm$^2$ with 2 mm silce thickness, $128\times32$ imaging matrix, 10 slices, TR 5.0 s, TEs=15, 40, and 15 msec for SEPI, GEPI, and STEPI. The first four measurements and next four pre-dynamic images were used for $B_1$ correction mapping. Multi-Hance (Gd-BOPTA, Bracco Diagnostics, Inc.) was injected via the catheterized tail vein with the dose of 0.1 mM Gd/kg.

Figure 9:
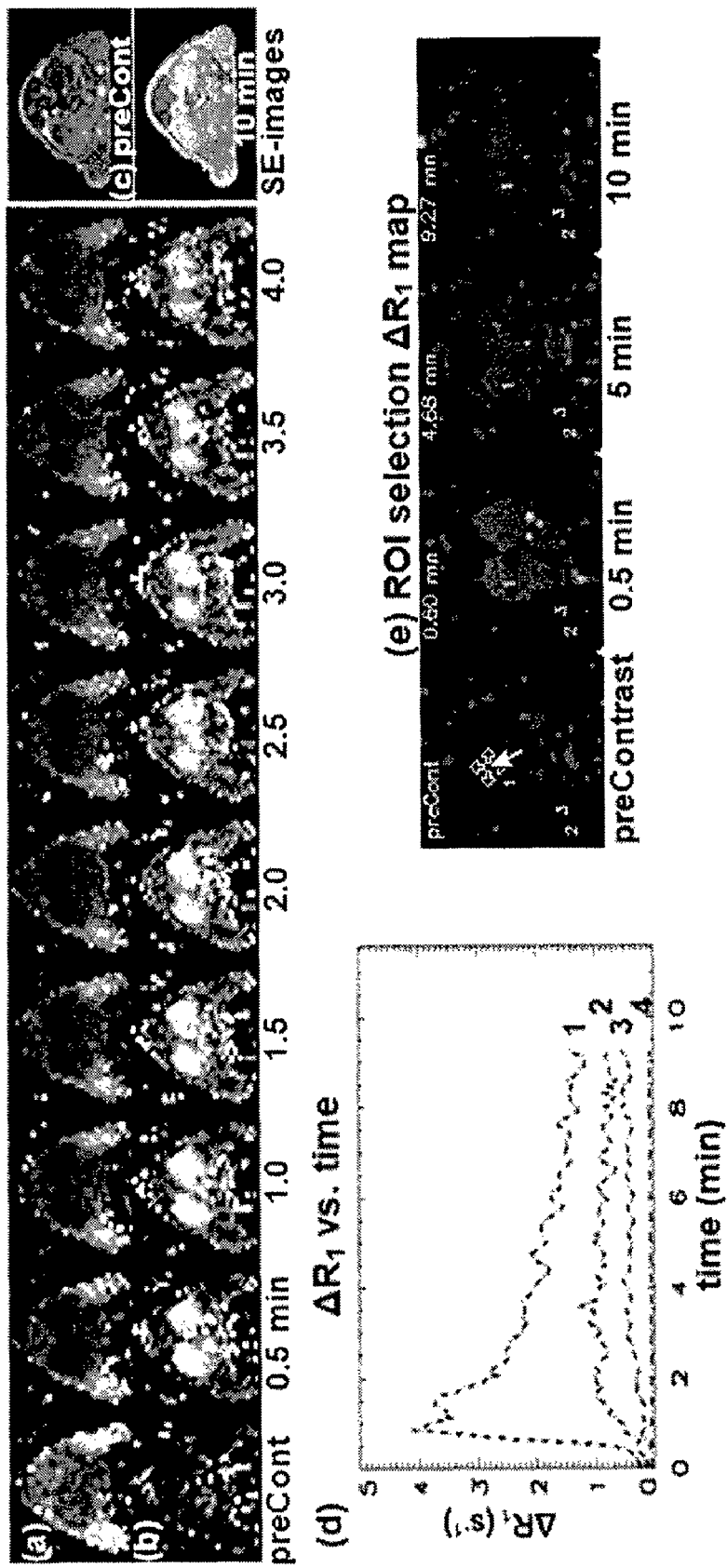
FIG. 9 show illustrates experimental results for $T_1$ mapping of tumor-bearing mice according to an embodiment of the invention.

Images in FIG. 9 are (a) $T_1$ and (b) $\Delta R_1$ maps of selected time points (every 30 seconds) from 120 total time frames acquired in 10 min. Note that 10 slices were obtained every 5 seconds in this DTM experiment. Images in Figure (c) are $T_1$ weighted spin-echo images of the same location as $T_1$ and $\Delta R_1$ maps in (a, b) for pre-contrast and 10 min after the injection. The brightness in (a) and (b) represents the larger values in $T_1$ and $\Delta R_1$ maps.

$\Delta R_1$ was plotted for selected ROIs with 9 pixels and all time points of 10 minutes, as numeric labels in FIG. 9(e). Regions of 3×3 pixels (18 μL=9×0.1×0.1×0.2 $cm^3$ volume) were selected at 1/kidney, 2/tumor periphery, 3/tumor core, and 4/background noise, and mean $\Delta R_1$ was plotted in FIG. 9(d) over the entire duration (10 minutes). Unlike other DCE-MRI method that uses the signal intensity as the concentration, the values $\Delta R_1(\vec{r})$ are directly proportional to the PBCA concentration. Therefore, these time-course $\Delta R_1$ maps can be used for further evaluation of pharmacokinetics in pixel-by-pixel or organ-based.

Figure 10:
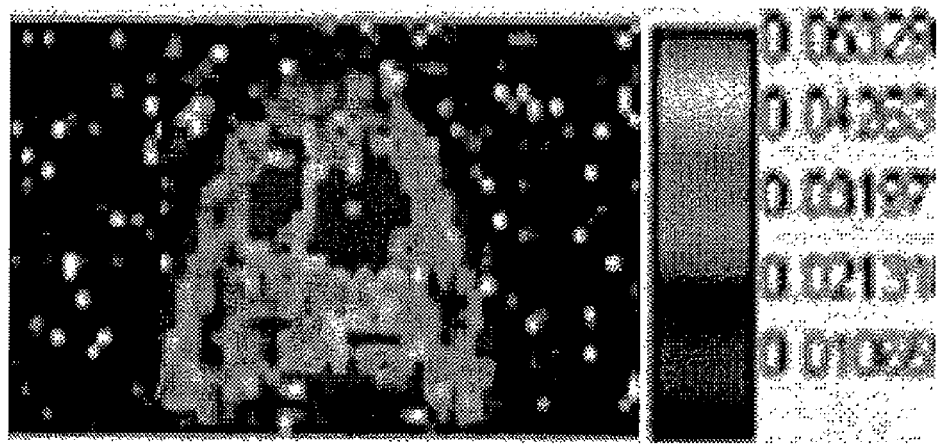
FIG. 10 shows a forward transfer map and a extracellular fractional map according to an embodiment of the invention.
Figure 10:
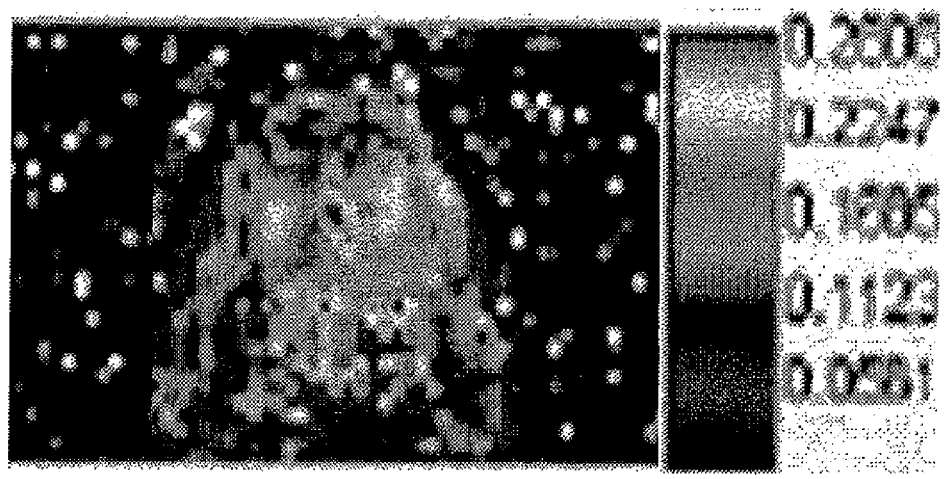

$\Delta R_1$ maps were used as the concentration maps to calculate pharmacokinetics parametric maps. Two compartment model and standard arterial input function were used to extract the forward transfer rate ($k^{trans}$) and the extracellular fractional volume maps, as shown in FIG. 10. FIG. 10(a) shows the $k^{trans}$ map and FIG. 10(b) shows the extracellular fractional volume map. These maps reflect the capillary permeability and the volume of the extracellular fluid.

Singleshot Measurements of $T_1$ of Human Brain

Figure 11:
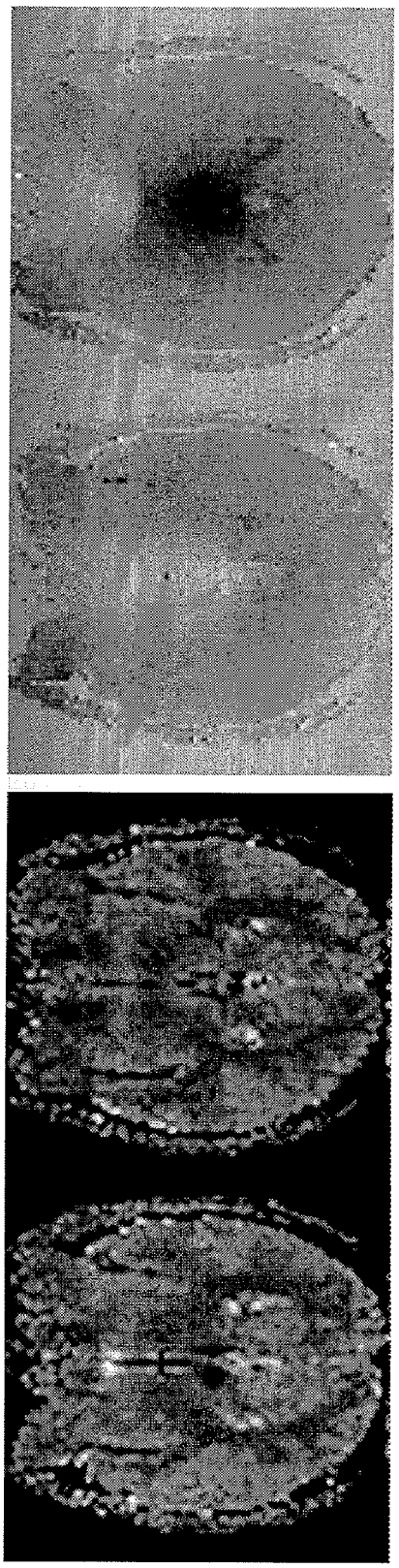
FIG. 11 shows singleshot $T_1$ and phase-difference mapping on a human brain according to an embodiment of the invention.

To demonstrate clinical applicability, 2D ss-SGSTEPI was applied to a human brain with TR 5 sec, 10 slices with 2×2×2 $mm^3$ spatial resolution, 2-average $B_1$ correction mapping, and TM 0.4 sec. After $B_1$ correction mapping acquisition, $T_1$ and phase-difference maps were obtained in every 5 sec. The phase-difference image was also constructed on-line by simply subtracting the phase image of SEPI from that of GEPI. FIG. 11 shows singleshot $T_1$ and phase-difference mappings on a human brain with TR 5 s, 2×2×2 $mm^3$ resolution. These maps were constructed on-line at the MRI system.

Applications for Estimating Concentration of Paramagnetic-Ion Based Contrast Agents Pharmacokinetic studies for drug development, and for evaluation of tumor perfusion require accurate estimation of the concentration of pharmaceuticals. Paramagnetic-ion based chelates, such as Gd-DTPA, Gd-DOTA, and Mn-EDTA, are MRI contrast agents (PBCA) commonly used to model pharmaceuticals, because they can be monitored approximately quantitatively by MR. Temporal changes in the MRI signal intensity of the water proton is then interpreted to extract kinetic parameters. Upon the introduction of a paramagnetic contrast agent, such as Gd-DTPA, the relaxation times ($T_1$, $T_2$, and $T_2^*$) of the water proton change depending on the local concentration of the contrast agent. Therefore, dynamic changes of the local contrast agent concentration may be obtained by measuring either $T_1$ or $T_2$.

Dynamic contrast enhanced MRI (DCE-MRI) has shown promise in detection and characterization of tumors, by providing information about important perfusion parameters such as vessel permeability, microvessel density, and washout, which may allow more accurate characterization of benign versus malignant neoplasms.

Physiologic variables that characterize tissue microcirculation (capillary permeability and volume of the extracellular fluid) are altered in pathological states. Dynamic contrast enhanced MRI (DCE-MRI) is frequently performed for the serial acquisition of MR images of interest to evaluate these parameters. By fitting the concentration-time curve to an appropriate pharmacokinetic model function, these physiologic parameters can be extracted. The accuracy of these parameters depends on the accuracy of the concentration mapping. Therefore, there are continuous demands to develop new and improved methods for precise measurement of kinetic parameters. For instance, conventional MRI of breast provides less specific information about the tumor than DCE-MRI and diffusion-weighted imaging (DWI), which can be used to make quantitative measurements of tissue properties that are relevant to the tumor progression and response to therapy.

Drug delivery research has revealed a clear need for an imaging method to improve quantitative drug measurements. Because of the rapid change in signal intensity and the time constraint of the available imaging techniques after injection of the Gd-Based contrast agent, a fast gradient echo (FGRE or turboFLASH) sequence has been used to dynamically monitor fast signal changes or $T_1$ weighted 2D spin-echo to dynamically monitor slow signal changes. Then, the change in signal intensity has been used to provide a semi-quantitative estimation of the drug quantity. However, the signal intensity of FGRE imaging is weighted by both $T_1$ and $T_2$ (or $T_2^*$). This $T_2^*$ shortening induces an error in the estimation of concentration. To improve the accuracy of drug concentration measurement, $T_2$ or $T_2^*$ effects must be removed from the GRE signal in DCE-MRI.

Increasing the concentration of the PBCA decreases both $T_1$ and $T_2$ relaxation times, and leads to an increase in the $T_1WI$ signal intensity but a decrease in the $T_2WI$ signal intensity. $T_2^*$ is strongly influenced by external factors, such as the location of the imaging FOV relative to the magnet center, and is much shorter than $T_2$. Particularly, $T_2^*$ shortening happens with high local concentrations of PBCA, as in the tumor periphery. Therefore, the signal intensity does not directly convert to the concentration of the PBCA, although it is commonly taken to do so in DCE-MRI assuming a linear relationship at low concentrations, i.e., changes in the relaxation rate $\Delta R_1(R_1=1/T_1)$ is linearly related to the local concentration of Gd(III)-based substance over a range of low concentrations in the solution phantom, and can be used to estimate Gd-DTPA concentration. Pharmacokinetic information can be obtained from the time-variation of $\Delta R_1(r)$.

Figure 12:
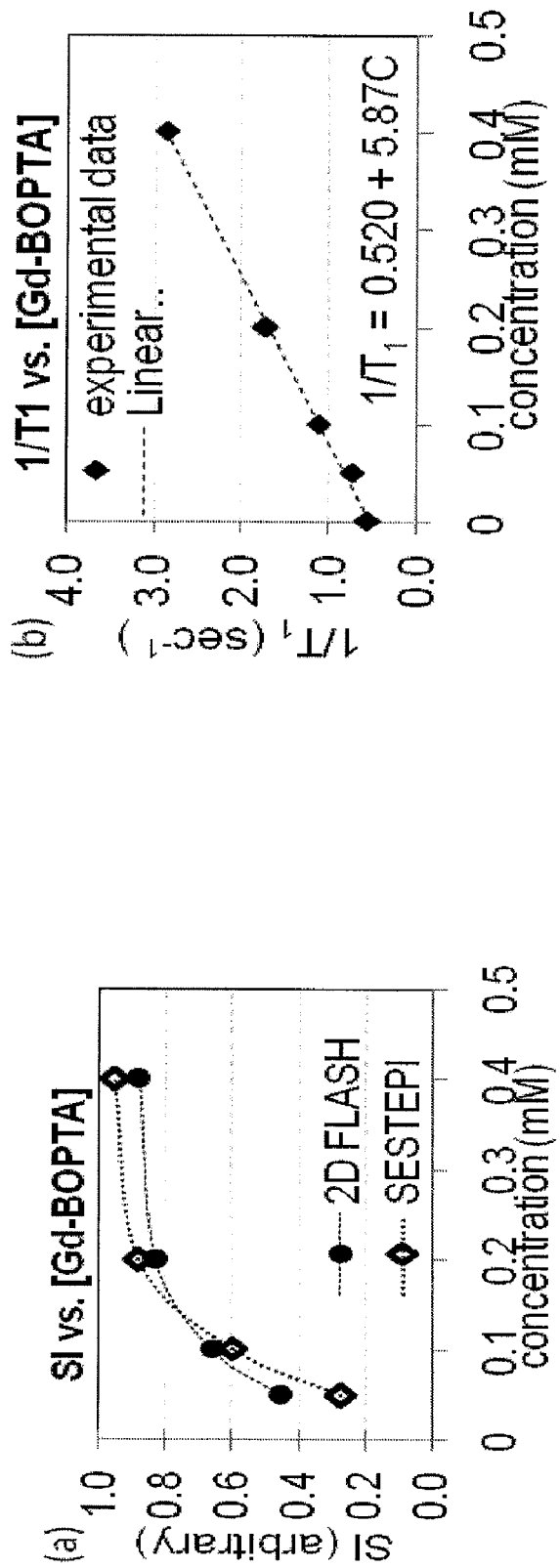
FIG. 12 shows plots of signal intensities of 2D ss-SG-STEPI, 2D turbo FLASH and $T_1$ vs. concentration of [Gd-BOPTA].

To demonstrate the non-linearity of SI vs. concentration, an MRI experiment was performed to measure $T_1$ and signal intensity of turbo-FLASH on a phantom with different concentrations of Gd-BOPTA (MultiHance, Bracco Diagnostics Inc.) using TR/TE=7.2/2.7 ms and flipangle 30°. The results are plotted in FIG. 12. FIG. 12(a) indicates that signal intensities of both turboFLASH (temporal resolution of 6 sec) and spin-EPI are non-linear even at low concentration. The dosage 0.1~0.2 mM [PBCA]/kg is the routine dosage for DCE-MRI and local concentrations may easily exceed 0.2~0.4 mM/kg in organs with high-blood supply or at the periphery of a tumor. The signal behavior of the gradient-echo MRI varies widely with the selection of TR, TE, and flipangle, and for $T_1$. Although a set of these imaging parameters may be linear for a small range of PBCA concentrations and specific $T_1$, it will not be linear for other $T_1$ values. In contrast, the $T_1$ relaxation rate ($1/T_1$) of the water proton was measured to be very linear with the concentration, as shown in FIG. 12(b). Thus, direct conversion of SI to the concentration is subject to large error, which will be propagated into the subsequent kinetic calculation. In contrast, the realtime $T_1$ mapping provided by embodiments of the invention described above is linearly related to the PBCA concentration. Thus, the realtime $T_1$ mapping provides accurate realtime estimation of the PBCA concentration resulting in improvement of the accuracy of drug-delivery or tumor evaluation.

A spin-echo sequence with either inversion-recovery (IR) or saturation-recovery (SR) is widely used to measure $T_1$. Application of these methods is limited to non-dynamic imaging because of their long imaging times of a few tens of minutes. Several alternative methods for rapid $T_1$ mapping have been presented including 2D singleshot-EPI (2D ss-EPI) and its variants (Look-Locker EPI, IR-EPI) which achieve better temporal resolution. However, the spatial resolution using these EPI-based methods is greatly limited by susceptibility artifacts. A multishot spin-echo EPI (ms-SEPI) sequence may be used to trade off imaging speed with the severity of the susceptibility artifact. Gradient-echo imaging with flip angle variation has been used with reasonable temporal and spatial resolution. However, the $T_1$ estimate obtained by this method is very sensitive to $B_1$ inhomogeneity and subject to large error unless $B_1$ inhomogeneity is corrected. All these techniques complete the data acquisition in multiple imagings for multiple recovery times and are subject to mis-registration or phase-error due to the subject's physiologic or voluntary motion. The $T_1$ mapping according to embodiments of the invention overcome these problems by calculating $T_1$ in a singleshot using SEPI and STEPI acquired in a singleshot acquisition using 2D ss-SESTEPI.

Reducing Geometric Distortion in EPI

Advantages of singleshot imaging using 2D singleshot EPI (2D ss-EPI) include rapid imaging, lack of motion-artifact, and high signal-to-noise ratio (SNR) per imaging time. These are crucial for quantitative MRI applications, such as diffusion MRI and phase measurement. However, 2D ss-EPI is very sensitive to the local variation of non-linear background gradient created by magnetic susceptibility differences at/near the tissue/air and tissue/bone interfaces. The resultant images suffer greatly from large geometric distortion that often renders the images useless. This distortion also limits the spatial resolution of EPI. Thus, its application is limited mostly to diffusion and functional MRI of the intracranial human brain, far from sinus and temporal bone, for which there is no alternative technique.

The degree of geometric distortion in 2D ss-EPI is inversely proportional to the increment of phase-encoding $\Delta k_y^{travel}$. $\Delta k_y^{travel}$ can be increased by reducing the imaging FOV, however, reduced FOV imaging within a large volume induces aliasing in the phase-encoding direction. Parallel imaging is commonly used to remove this aliasing artifact. It requires a multi-channel phased-array RF coil and even then, residual aliasing may greatly reduce the accuracy of the quantitative MRI. Inner-volume-imaging or reduced FOV eliminate the aliasing artifact by applying two RF pulses with slice selection gradients applied perpendicular to each other. Spatial saturation is often used to eliminate the signal contribution from spins outside the reduced FOV. The success of reduced FOV imaging using spatial saturation relies greatly on the spatial homogeneity of the RF field, which is never perfect. ZOOM-EPI was the first interleaved multi inner slice imaging technique. However, it is very time-inefficient because the technique measures images of the adjacent slices in different acquisitions. 2D spectro-spatial excitation was used to limit the RF excitation both in slice and phase-encoding directions. Generally, the spatial profile of the coverage is very poor using the 2D excitation RF pulse.

Figure 13:
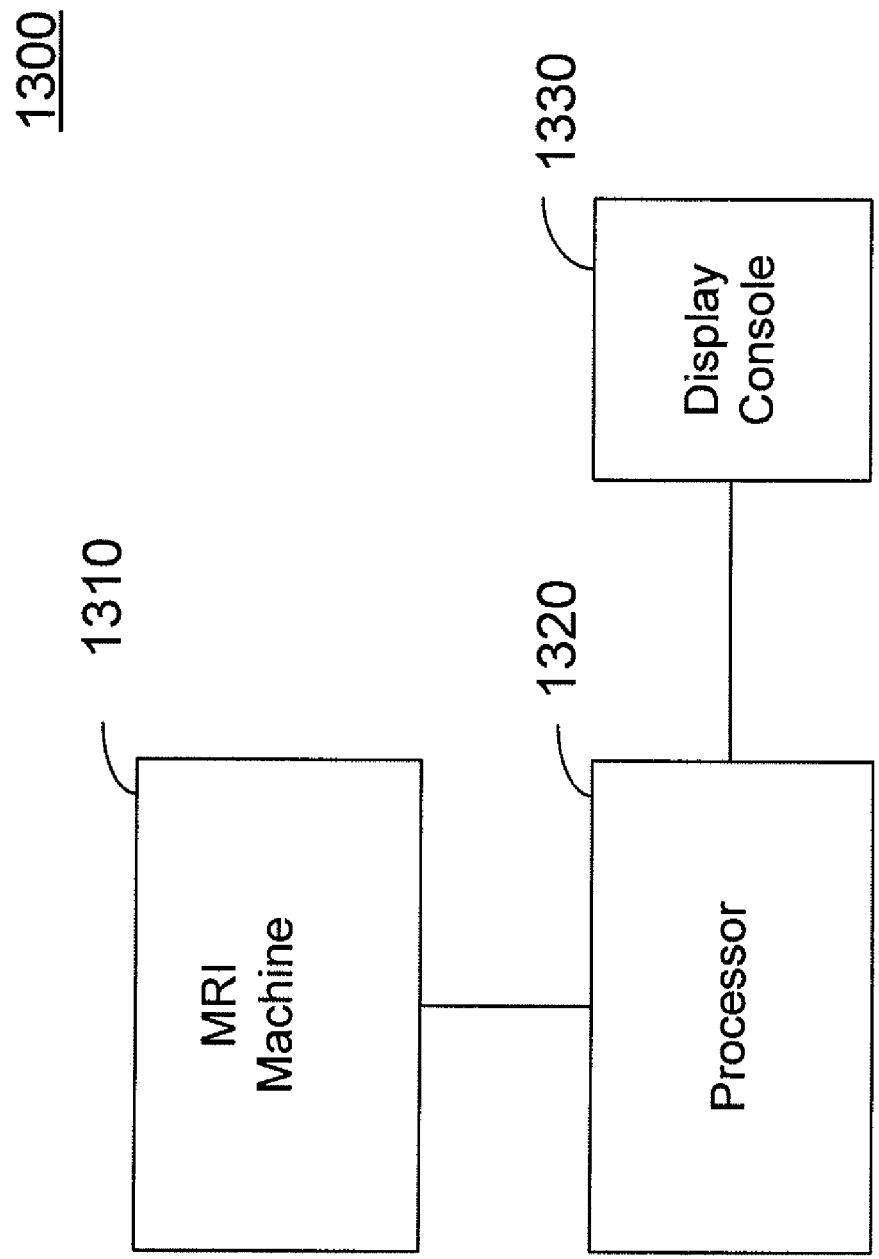
FIG. 13 shows a diagram of an imaging system according to an embodiment of the invention.

A more efficient interleaved multi-inner-volume (IMIV) imaging technique may be used, which is disclosed in Jeong E K, Kim S E, Kholmovski E G, Parker D L "High-resolution DTI of a localized volume using 3D single-shot diffusion-weighted STimulated echo-planar imaging (3D ss-DW-STEPI)" Magn Reson Med 2006; 56(6):1173-1181, and in Jeong E K, Kim S E, Guo J, Kholmovski E G, Parker D L "High-resolution DTI with 2D interleaved multislice reduced FOV single-shot diffusion-weighted EPI (2D ss-rFOV-DWEPI)" Magn Reson Med 2005; 54(6):1575-1579, both of which are incorporated herein by reference. Interleaved multi-inner volume/slice imaging (IMIV) can be implemented in 2D ss-SESTEPI by applying a pair of adiabatic 180° pulses sandwiched by crusher gradient pulses with a slice-selection gradient along the phase-encoding direction to spoil transverse magnetization outside the phase-FOV. Thus, the 2D ss-SGSTEPI according to embodiments of the invention can use interleaved multi inner volume/slice (IMIV) imaging capability to reduce the geometric distortion in the EPI images and image a small region within a large surrounding without aliasing FIG. 13 shows an exemplary imaging system 1300 that can be used to perform the 2D ss-SESTEPI and SGSTEPI according to embodiments of the invention. The imaging system 1300 includes an MRI machine 1310, a processor 1320 and a display console 1330. The MRI machine may comprise, for example, a Siemans Trio 3 Telsa MRI system, which was used in the MRI experiments described above. The processor 1320 may instruct the MRI machine 1310 to acquire SEPI/GEPI/STEPI in a singleshot, for example, by instructing the MRI machine 1310 to perform the pulses sequences in FIGS. 1, 3 and/or 4. The processor 1320 may then receive the resulting SEPI/GEPI/STEPI data from the MRI machine 1310 and process the data, for example using the techniques described above. For example, the processor 1320 may compute a $T_1$ map based on the SEPI and STEPI data according to embodiments of the invention. The processor 1320 may also compute PBCA concentrations in a subject based on the computed $T_1$ map. In another example, the processor 1320 may use the GEPI and STEPI to compute change in temperature based on the phase difference between GEPI and STEPI according to embodiments of the invention. The processor 1320 may output the processed data to a user (physician) as an image on the display console 1330 or a report, such as a $T_1$ map or report for generation or review by a radiologist or other health care professional. The SEPI, STEPI and GEPI images may or may not be displayed to the user. For example, the processor 1320 may use the signal intensities of the SEPI and STEPI to compute the $T_1$ map and display the $T_1$ map on the display console 1330 without displaying the SEPI or STEPI.

Those skilled in the art will appreciate that the systems and methods described in connection with the embodiments disclosed herein may be implemented or performed with general purpose processors, a digital signal processors (DSPs), application specific integrated circuit (ASICs), field programmable gate array (FPGAs), logic programmable devices, discrete hardware components, or any combination thereof. Further, the algorithms performed by the beamformers and controllers may be embodied in software executed by a processor, directly in hardware, or a combination thereof. The software may be stored in memory or any computer-readable storage medium known in the art.

The memories described in the disclosure may comprise machine readable media. Readable media may include storage integrated into a processor, such as might be the case with an ASIC, and/or storage external to a processor. By way of illustration, and not limitation, readable media may include one or more of volatile memory, nonvolatile memory, a Random Access Memory (RAM), a flash memory, a Read Only Memory (ROM), a Programmable Read-Only Memory (PROM), an Erasable PROM (EPROM), a register, a hard disk, a removable disk, a CD-ROM, a DVD, or any other suitable storage device. In addition, readable media may include a transmission line or a carrier wave that encodes a data signal. A readable medium may be a computer-readable medium encoded or stored with a computer program or instructions. The computer program or instructions may be executable by a transmitter or receiver device or by a processing system of a transmitter or receiver device.

Those of skill in the art would appreciate that the various illustrative blocks, modules, elements, components, methods, and algorithms described herein may be implemented as electronic hardware, computer software, or combinations of both. Furthermore, these may be partitioned differently than what is described. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application.

It is understood that the specific order or hierarchy of steps or blocks in the processes disclosed is an illustration of exemplary approaches. Based upon design preferences, it is understood that the specific order or hierarchy of steps or blocks in the processes may be rearranged. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." All structural and functional equivalents to the elements of the various aspects described throughout this invention that are known or later come to be known to those of ordinary skill in the art are expressly incorporated herein by reference and are intended to be encompassed by the claims. Moreover, nothing disclosed herein is intended to be dedicated to the public regardless of whether such invention is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A method of acquiring both magnetic resonance spin echo planar image (SEPI) data and stimulated echo planar image (STEPI) data, in response to a single radio frequency (RF) excitation pulse sequence, the method comprising the activities of:
    exciting, with a first radio frequency (RF) pulse, nuclei to produce an initial transverse magnetization in a region of a patient;
    splitting, with a second RF pulse, the initial transverse magnetization into a first magnetization component and a second magnetization component, said first magnetization component and said second magnetization component comprising quadrature components;
    acquiring, with an RF detector, spin echo planar image (SEPI) data of an image slice of said region using the first magnetization component; and
    acquiring, with said RF detector, stimulated echo planar image (STEPI) data of said image slice of said region using the second magnetization component.

2. The method of claim 1, wherein the SEPI data and STEPI data are of approximately a same image slice volume of the patient.

3. The method of claim 1, further comprising outputting an output data set to a display, based on the acquired SEPI data of said image slice and the acquired STEPI data of said image slice, the output data set comprising at least one of a magnetic resonance image and a report.

4. The method of claim 1, further comprising:
    after the transverse second magnetization has returned to a longitudinal plane, tipping, with an applied third RF pulse, the second magnetization into the transverse plane, the transverse plane being transverse to the longitudinal plane; and
    acquiring the STEPI data with the second magnetization in the transverse plane, in response to the applied third RF pulse.

5. The method of claim 1, wherein the first RF pulse is a $90°_x$ pulse and the second RF pulse is a $90°_{-x}$ pulse.

6. The method of claim 1, further comprising:
    dephasing the initial transverse magnetization using a dephasing crusher gradient pulse; and
    rephasing the first magnetization using a rephasing crusher gradient pulse.

7. The method of claim 1, further comprising generating a $T_1$ map of the slice of the patient using the acquired STEPI data of said image slice and the acquired SEPI data of said image slice.

8. The method of claim 7, wherein generating the $T_1$ map comprises:
    computing logarithms of signal intensities of the acquired STEPI data of said image slice and the acquired SEPI data of said image slice; and
    performing a linear fitting on the logarithms of the signal intensities of the acquired STEPI data of said image slice and acquired SEPI data of said image slice.

9. The method of claim 7, wherein generating the $T_1$ map comprises:
    generating a correction map that corrects for $B_1$ field inhomogeneity; and
    modifying the acquired STEPI data of said image slice using the correction map, wherein the $T_1$ map is generated using the modified acquired STEPI data of said image slice and the acquired SEPI data of said image slice.

10. The method of claim 9, wherein generating the correction map comprises:
    after the transverse second magnetization has returned to a longitudinal plane, tipping, with an applied third RF pulse, the second magnetization into the transverse plane, the transverse plane being transverse to the longitudinal plane; and
    acquiring the STEPI data with the second magnetization in the transverse plane, in response to the applied third RF pulse;
    repeating the first, second and third RF pulses; and
    acquiring a second STEPI dataset of said image slice with a minimum mixing time between the repeated second PF pulse and the repeated third RF pulse, wherein the correction map is generated using the second STEPI dataset of said image slice and the acquired SEPI data of said image slice.

11. The method of claim 10, wherein the minimum mixing time is substantially 10 milliseconds or less.

12. The method of claim 10, wherein generating the correction map comprises dividing the second STEPI dataset of said image slice by the initially acquired SEPI data of said image slice.

13. The method of claim 7, further comprising estimating concentrations levels of a contrast agent in the patient using the generated $T_1$ map.

14. The method of claim 13, wherein the contrast agent is a paramagnetic-ion based contrast agent.

15. The method of claim 1, further comprising acquiring gradient EPI (GEPI) data of said image slice using the first magnetization and determining a phase difference between the acquired SEPI and the GEPI data of said image slice.

16. The method of claim 15, further comprising determining a temperature-dependent chemical shift based on phase difference between the acquired SEPI data of said image slice and the acquired GEPI data of said image slice.

17. The method of claim 15, further comprising determining a temperature change in the patient during a heat treatment procedure based temperature-dependent chemical shift from the acquired magnetic resonance imaging SEPT, SEPI or GEDI data.

18. The method of claim 16, wherein determining the temperature-dependent chemical shift comprises:

dividing the phase difference between the acquired SEPI data and the acquired GEPI data by a time between acquisitions of the acquired SEPI data and the acquired GEPI data in order to obtain a frequency distribution; and dividing the frequency distribution by a magnetic resonance frequency of an imaged substance.

19. An apparatus configured for processing magnetic resonance spin echo planar image (SEPI) data and stimulated echo planar image (STEPI) data, in response to a single radio frequency (RF) excitation pulse sequence, the apparatus comprising:

a processing module that receives (i) SEPI data, acquired with an RF detector from of an image slice of a region of a patient, in response to a first magnetization component, and (ii) STEPI data, acquired with said RF detector from of said image slice of said region of a patient, in response to a second magnetization component;

wherein the first and second magnetizations result from exciting, with a first RF pulse, nuclei to produce an initial transverse magnetization in said region of said patient, and then splitting, with a second RF pulse, the initial transverse magnetization into said first magnetization component and said second magnetization component, said first magnetization component and said second magnetization component being quadrature components;

wherein the processing module processes the acquired SEPI data and the acquired STEPI data into an output data set provided to a display, the output data set configured to produce at least one of a magnetic resonance image of said patient and a report.

20. The apparatus of claim 19, wherein the processing module sends instructions to a magnetic resonance imaging apparatus in order to perform a single RF pulse sequence for acquiring the SEPI and STEPI data.

* * * * *